United States Patent
Lee et al.

(10) Patent No.: US 7,079,401 B2
(45) Date of Patent: Jul. 18, 2006

(54) HEAT SINK CLIP ASSEMBLY WITH CAMMED CLIP HANDLES

(75) Inventors: Hsieh Kun Lee, Tu-Chen (TW); Dongyun Lee, Shenzhen (CN); Zhijie Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 329 days.

(21) Appl. No.: 10/680,353

(22) Filed: Oct. 6, 2003

(65) Prior Publication Data

US 2004/0114332 A1   Jun. 17, 2004

(30) Foreign Application Priority Data

Dec. 13, 2002  (TW) .............................. 91220216 U

(51) Int. Cl.
 *H05K 7/18* (2006.01)
(52) U.S. Cl. ..................................... 361/801
(58) Field of Classification Search ................ 361/709, 361/701, 702, 703, 704, 747, 752, 801, 802, 361/719, 80.3; 165/80.3
See application file for complete search history.

(56) References Cited

U.S. PATENT DOCUMENTS

| | | | |
|---|---|---|---|
| 6,205,026 B1 | | 3/2001 | Wong et al. |
| 6,219,241 B1 * | 4/2001 | Jones | 361/704 |
| 6,430,051 B1 * | 8/2002 | Yang et al. | 361/704 |
| 6,522,545 B1 * | 2/2003 | Shia et al. | 361/704 |
| 6,542,367 B1 * | 4/2003 | Shia et al. | 361/703 |
| 6,570,763 B1 * | 5/2003 | McHugh et al. | 361/704 |
| 6,822,869 B1 * | 11/2004 | Huang et al. | 361/704 |
| 2003/0209341 A1 * | 11/2003 | Deboer et al. | 165/80.3 |

FOREIGN PATENT DOCUMENTS

TW                507894         10/2002

* cited by examiner

*Primary Examiner*—Kamand Cuneo
*Assistant Examiner*—Ivan Carpio
(74) *Attorney, Agent, or Firm*—Wei Te Chung

(57) ABSTRACT

A heat sink clip assembly (1) for attaching a heat sink (5) on a CPU (7) includes a retention frame (10), and a pair of clips (20) pivotally attached to two sides of the retention frame. Each clip includes a main body (21), and a handle (41) pivotally attached to the main body. The main body includes a cross beam (23), and two locking arms (31) respectively depending from opposite ends of the cross beam. Each locking arm defines a locking hole (33) at a distal end. The handle has a cam portion (47) at one end thereof. The clips are pivoted outwardly to make way for the heat sink to seat on the CPU. Then the clips are pivoted upwardly, so that the cross beam is suspended above the heat sink. The handle is pivoted downwardly so that the cam portion presses the heat sink to the CPU.

19 Claims, 4 Drawing Sheets

HEAT SINK CLIP ASSEMBLY WITH CAMMED CLIP HANDLES

BACKGROUND OF THE INVENTION

1. Field of the Invention

The present invention relates to a heat sink clip assembly, and more specifically to a heat sink clip assembly which readily secures a heat sink onto an electronic package.

2. Related Art

Developments in today's highly information-intensive society have led to remarkable improvements in performances of electronic devices. During operation of many contemporary electronic devices, large amounts of heat are produced. Heat sinks are often attached to the electronic devices to remove heat therefrom.

Various clips are used to attach heat sinks onto the electronic devices. A conventional heat sink clip assembly as disclosed in U.S. Pat. No. 6,205,026, includes a pair of retention modules and a pair of clips. Each clip includes a curved pressing portion, and two legs depending from the pressing portion. A locking hole is defined in each leg. Each retention module is U-shaped. The retention modules are mounted on a circuit board at opposite sides of a Central Processing Unit (CPU). The locking holes of the clips engagingly receive catches of the retention modules.

However, the clips are usually hard, and extra tools are often needed to manipulate the clips so that the locking holes can receive the catches. Furthermore, the clips and retention modules are separate parts, which complicates the processes of packaging, transportation and subsequent assembly.

Therefore, an improved heat sink clip assembly which overcomes the above-mentioned problems is desired.

BRIEF SUMMARY OF THE INVENTION

Accordingly, an object of the present invention is to provide a heat sink clip assembly which readily secures a heat sink onto a Central Processing Unit (CPU).

Another object of the present invention is to provide a heat sink clip assembly which facilitates transportation and assembly thereof.

To achieve the above-mentioned objects, a heat sink clip assembly in accordance with the present invention is used to attach a heat sink on a CPU. The heat sink clip assembly comprises a retention frame, and a pair of clips pivotally attached to two sides of the retention frame. Each clip comprises a main body, and a handle pivotally attached to the main body. The main body comprises a cross beam, and two locking arms respectively depending from opposite ends of the cross beam. Each locking arm defines a locking hole at a distal end thereof. The handle has a cam portion at one end thereof. The clips are pivoted outwardly to make way for the heat sink to seat on the CPU. Then the clips are pivoted upwardly, so that the cross beam is suspended above the heat sink. The handle is pivoted downwardly so that the cam portion presses the heat sink to the CPU.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
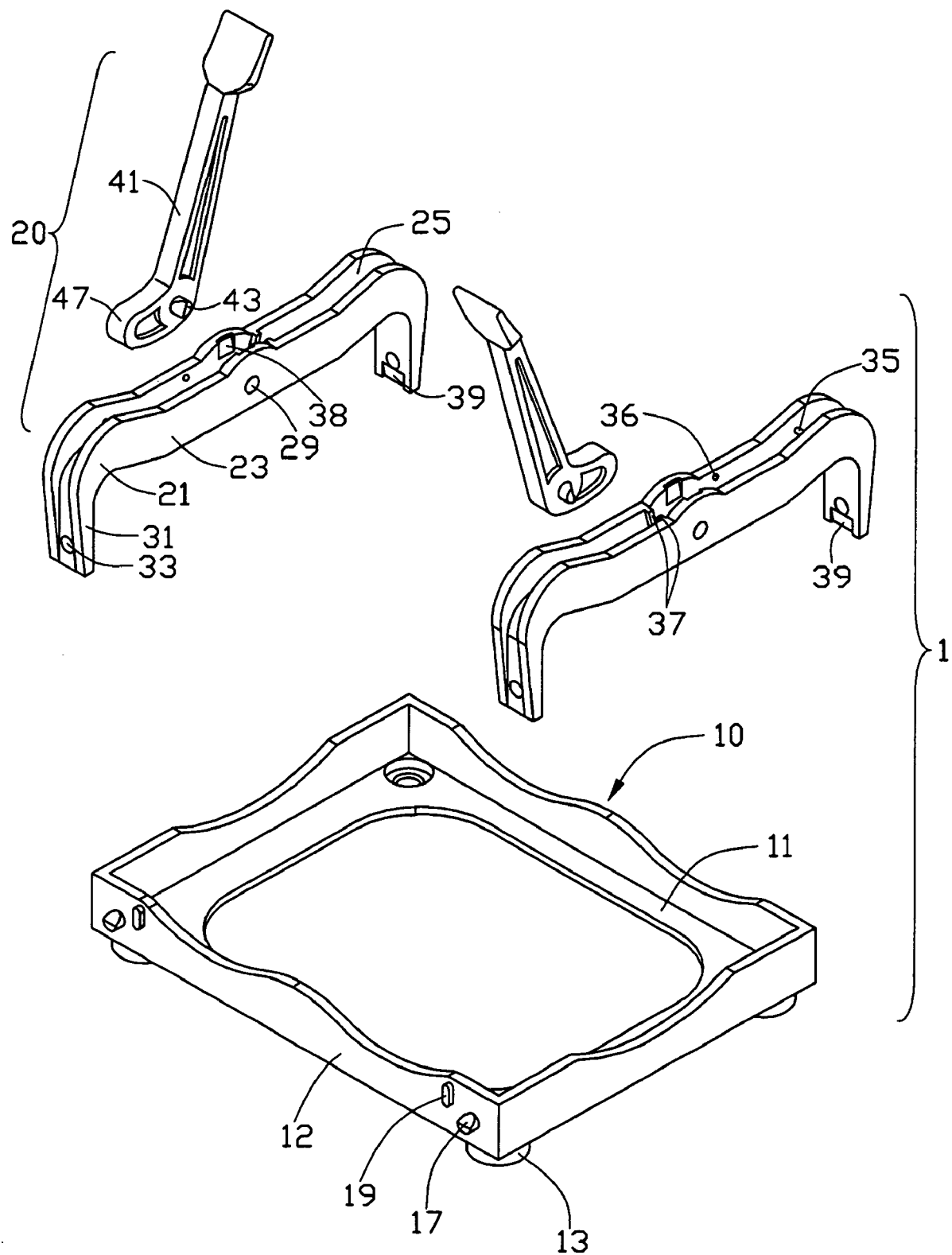
FIG. 1 is an exploded, isometric view of a heat sink clip assembly in accordance with a preferred embodiment of the present invention, the heat sink clip assembly comprising a pair of clips and a retention frame.
Figure 2:
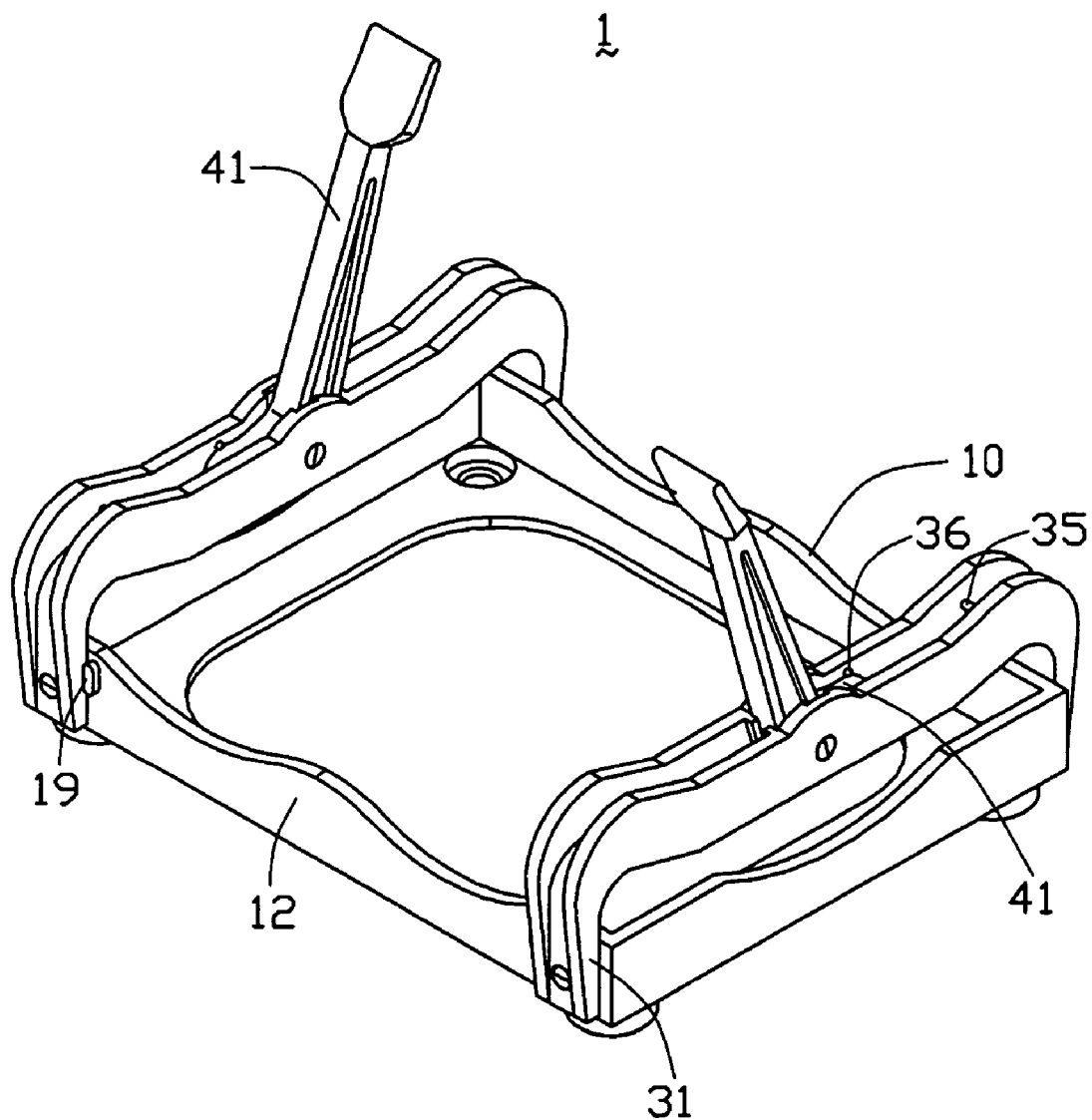
FIG. 2 is an assembled view of FIG. 1, showing the clips in respective unlocked positions.
Figure 3:
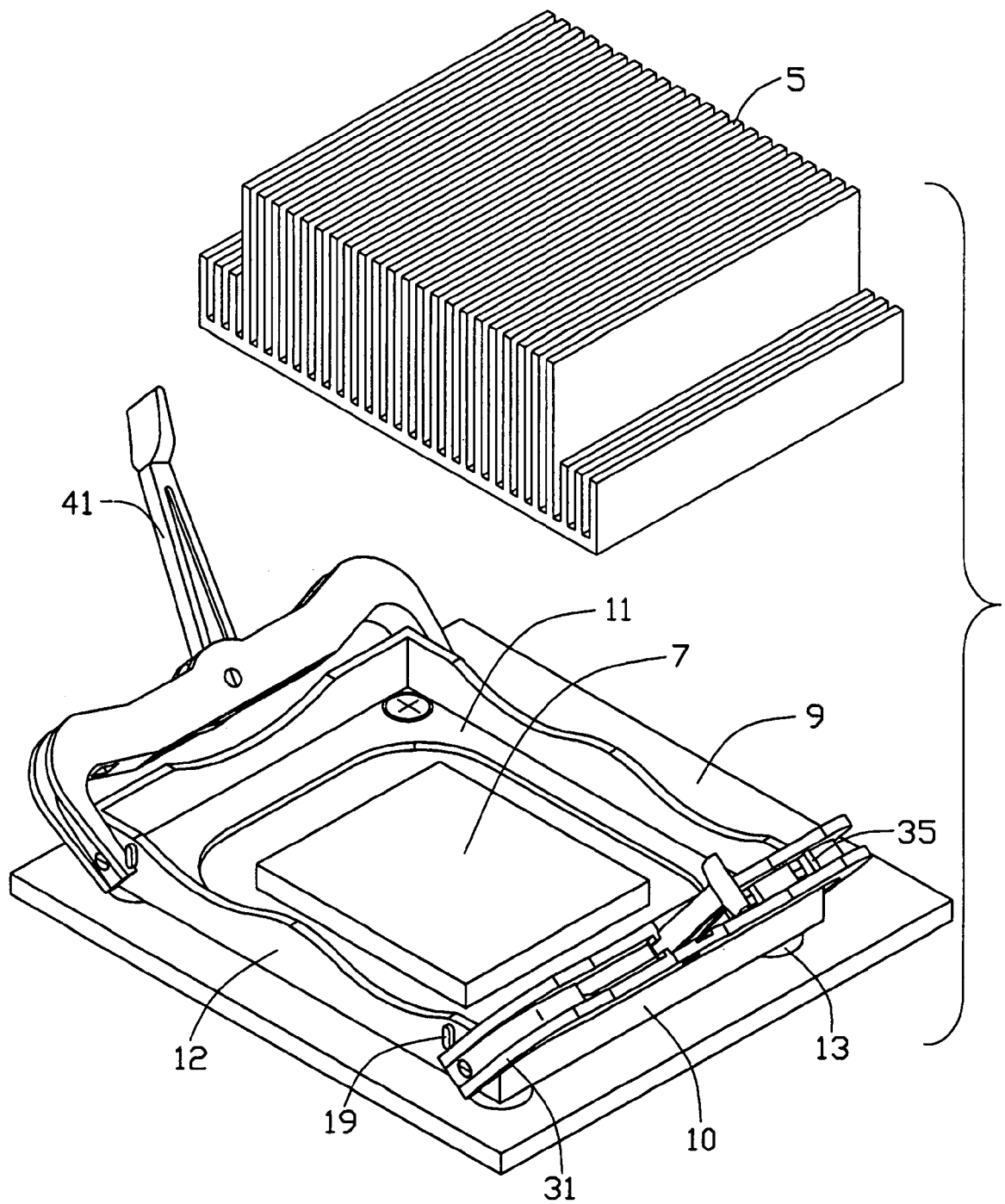
FIG. 3 is an isometric view of the heat sink clip assembly of FIG. 2 and a CPU mounted on a printed circuit board (PCB), and showing a heat sink ready to be attached on the CPU.
Figure 4:
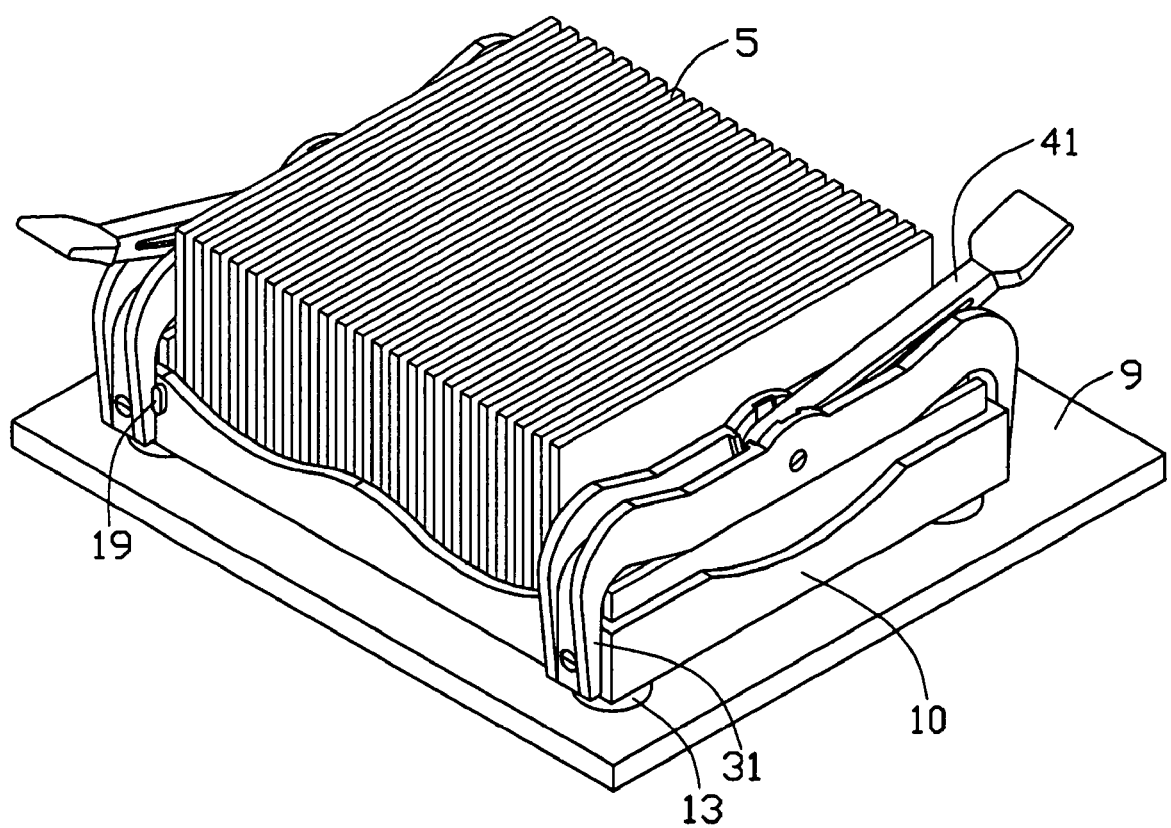
FIG. 4 is an assembled view of FIG. 3.

Referring to FIGS. 1–4, a heat sink clip assembly 1 in accordance with the preferred embodiment of the present invention is used to attach a heat sink 5 to a CPU 7 that is mounted to a PCB 9. The heat sink clip assembly 1 comprises a retention frame or rack 10, and a pair of clips 20.

The retention frame 10 has a rectangular base 11, and four side plates 12 extending perpendicularly from the base 11. A central opening is defined in the base 11 for accommodating the CPU 7 therein. Four standoffs 13 depend from four corners of the base 11, respectively. A pair of pivots 17 is formed at opposite ends of each of two opposite of the side plates 12. A pair of stops 19 is formed on each of said two opposite of the side plates 12. The stops 19 are between the corresponding pivots 17 and adjacent said pivots 17 respectively.

Each clip 20 comprises a main body 21, and a cammed handle 41 pivotally attached to the main body 21. The main body 21 comprises a cross beam 23, and two locking arms 31 depending from opposite ends of the cross beam 23 respectively. A locking hole 33 is defined in a distal end of each locking arm 31. A first slanted notch 39 is defined in an inside of the distal end of each locking arm 31, for facilitating the locking arm 31 sliding along the corresponding pivot 17 of the retention frame 10. A long slot 25 is defined in a top side of the cross beam 21. A vertical through opening (not shown) is defined in a center of the cross beam 21, in communication with the long slot 25. A pair of aligned pivot holes 29 is respectively defined in central portions of opposite side walls of the cross beam 21. The pivot holes 29 are cooperatively perpendicular to the vertical through opening.

The handle 41 comprises a cam portion 47 at one end, and a pair of pins 43 protruding outwardly from opposite sides of the cam portion 47 respectively. The pins 43 are pivotally received in the pivot holes 29 of the main body 21. The cam portion 47 of the handle 41 is thus movably received in the vertical through opening of the main body 21. A transverse blocking bar 35 is formed in the long slot 25 near one end of the cross beam 23, for preventing the handle 41 from over-rotating into the long slot 25, and for facilitating optimal positioning of the cam portion 47 when it presses the heat sink 5. A pair of protrusions 36 extends toward each other from the side walls of the cross beam 23 respectively, the protrusions 36 being located between the vertical through opening and the blocking bar 35. The protrusions 36 prevent the handle 41 from rebounding when the cam portion 47 presses the heat sink 5. A pair of blocking tabs 37 extends toward each other from the side walls of the cross beam 23 respectively, the blocking tabs 37 being located adjacent the vertical through opening and distal from the protrusions 36. The blocking tabs 37 limit an angle of rotation of the handle 41. A pair of second slanted notches 38 is defined in the side walls of the cross beam 23 respectively, for facilitating entry of the pins 43 of the handle 41 into the vertical through opening of the cross beam 23.

In assembly, the retention frame 10 is attached to the PCB 9 around the CPU 7. The handles 41 of the clips 20 are pivotally attached to the main bodies 21, with the pins 43 being snappingly received in the pivot holes 29 of the cross beams 23. The clips 20 are pivotally attached to the retention frame 10, with the pivots 17 being snappingly received in the locking holes 33 of the clips 20. The clips 20 are then rotated outwardly. The handle 41 of each clip 20 is positioned perpendicularly relative to the cross beam 23. Therefore, the cam portion 47 is outside the vertical through opening of the cross beam 23. The heat sink 5 is placed on the CPU 7 and accommodated in the retention frame 10. The clips 20 are rotated upwardly, so that the cross beams 23 are suspended just above corresponding shoulders of the heat sink 5. The locking arms 31 of the clips 20 abut the stops 9, and the clips 20 are thereby prevented from being over-rotated. Then, the handle 41 of each clip 20 is rotated downwardly. The handle 41 rides over the protrusions 36, and the cam portion 47 of the handle 41 presses the corresponding shoulder of the heat sink 5. The clips 20 thereby resiliently secure the heat sink 5 on the CPU 7. The protrusions 36 of the cross beams 23 prevent the handles 41 from rebounding back up.

It is understood that the invention may be embodied in other forms without departing from the spirit thereof. Thus, the present example and embodiment are to be considered in all respects as illustrative and not restrictive, and the invention is not to be limited to the details given herein. For example, the locking hole 33 may be in a somewhat significantly elongated form and the stop 19 is little reshaped so as to allow the clip 20 to be inwardly retracted during a horizontal manner for the compact-sized delivery. Alternately, the pivot 17 and the locking hole 33 may be oppositely applied on the clip 20 and the retention frame 10, respectively.

What is claimed is:

1. A clip assembly for attaching a heat sink to an electronic package that is mounted to a circuit board, comprising:
   a retention frame adapted to be attached to the circuit board around the electronic package, at least a pair of pivot means respectively formed at opposite sides of the retention frame; and
   at least one clip pivotally attached to the retention frame at the at least a pair of pivot means, the at least one clip comprising a main body and a handle pivotally connected to the main body, the handle forming a cam portion at one end thereof and being adapted to press the heat sink to the electronic package; wherein
   when the at least one clip is rotated outwardly to make way for the heat sink to rest on the electronic package, the cam portion of the handle does not contact the heat sink; and when the at least one clip is rotated inwardly, the handle is suspended above the heat sink and can be rotated so that the cam portion resiliently presses the heat sink to the electronic package.

2. The clip assembly as described in claim 1, wherein the retention frame comprises a base, and a pair of side plates extending from opposite sides of the base.

3. The clip assembly as described in claim 1, wherein a stop is formed in the vicinity of one of the at least a pair of pivot means.

4. The clip assembly as described in claim 1, wherein said at least a pair of pivot means comprises at least a pair of pivots extending outwardly from said opposite sides of the retention frame.

5. The clip assembly as described in claim 4, wherein the main body of the at least one clip comprises a cross beam, and a pair of locking arms extending from opposite ends of the cross beam, the locking arms defining a pair of locking holes pivotally receiving the pivots of the retention frame.

6. The clip assembly as described in claim 5, wherein the main body comprises a pair of side walls at opposite sides of the cross beam, the side walls defines a slot therebetween, and the cam portion is received in the slot.

7. The clip assembly as described in claim 6, wherein a vertical through opening is defined in a center of the cross beam, the side walls of the cross beam define a pair of pivot holes, a pair of pins protrudes outwardly from opposite sides of the cam portion, and the pins are pivotably engaged in the pivot holes of the cross beam.

8. The clip assembly as described in claim 7, wherein a pair of second slanted notches is defined in the side walls of the cross beam, for facilitating entry of the pins of the handle into the slot.

9. The clip assembly as described in claim 6, wherein a blocking member is formed in the slot near one end of the cross beam, for preventing the handle from over-rotating into the slot.

10. The clip assembly as described in claim 6, wherein a protrusion is formed on an inner side of one of the side walls, for preventing the handle from rebounding.

11. The clip assembly as described in claim 6, wherein a blocking member extends from an inner side of one of the side walls near the vertical through opening, for limiting an angle of the rotation of the handle.

12. The clip assembly as described in claim 5, wherein a first slanted notch is defined in an inner side of a distal end of each of the locking arms, for facilitating the locking anus sliding along the corresponding pivots of the retention frame.

13. A heat sink assembly comprising:
    a retention frame attached on a circuit board, the retention frame comprising at least a first pivot means at opposite sides thereof;
    a heat sink attached on an electronic package that is mounted to the circuit board, the retention frame being disposed around the heat sink;
    at least one clip pivotally attached to the retention frame at the at least a first pivot means, the at least one clip comprising a main body and a handle, the main body having a second pivot means, the handle being pivotally connected to the main body at the second pivot means, the handle forming a cam portion at one end thereof for pressing the heat sink to the electronic package; wherein
    the at least one clip pivots in a first direction in order to make way for the heat sink to rest on the electronic package, and the handle pivots in a second direction substantially perpendicular to the first direction in order to press on the heat sink.

14. The heat sink assembly as described in claim 13, wherein the at least a first pivot means comprises a pair of pivots protruding from said opposite sides of the retention frame.

15. The heat sink assembly as described in claim 14, wherein the main body comprises a cross beam, two locking arms extend from opposite ends of the cross beam, a distal end of each of the locking arms defines a locking hole, the locking holes pivotally receiving the pivots of the retention module.

16. The heat sink assembly as described in claim 13, wherein the second pivot means comprises a pair of pivot holes defined in opposite side walls of the main body, two pins protrude outwardly from opposite sides of the handle, and the pins are pivotably engaged in the pivot holes of the main body.

17. A heat sink assembly comprising:
- a printed circuit board;
- a retention frame secured to the printed circuit board;
- an electronic package assembly mounted to the printed circuit board adjacent to said retention frame;
- a heat sink seated upon the electronic package assembly; and
- at least one clip including a main body pivotably mounted to the retention frame about a pivot extending along a horizontal direction, said clip further including an operation portion moveable relative to the main body; wherein said clip is in a tensioned manner when said operation is in a first operation so as to urge, in a vertical direction, the heat sink tightly abut against the electronic assembly; said clip is in a relaxed manner when said operation portion is in a second position so as to allow the clip to be movable relative to the retention frame for loading/unloading the heat sink with regard to the electronic package assembly;

wherein there are a pair of clips respectively mounted to two opposite ends of the retention frame.

18. The assembly as described in claim 17, wherein said operation portion is pivotally mounted to the main portion about another pivot extending along another horizontal direction perpendicular to both said horizontal direction and said vertical direction.

19. The assembly as described in claim 17, wherein said retention frame further includes a stopper for restricting rotation of the clip relative to the retention frame.

* * * * *